United States Patent [19]

Asahi et al.

[11] Patent Number: 4,857,859

[45] Date of Patent: Aug. 15, 1989

[54] AM DIGITAL DEMODULATOR

[75] Inventors: Nobumitsu Asahi, Sagamihara; Akira Nakazawa, Tokyo, both of Japan

[73] Assignee: Kabushiki Kaisha Kenwood, Tokyo, Japan

[21] Appl. No.: 208,134

[22] Filed: Jun. 17, 1988

[30] Foreign Application Priority Data

Jun. 18, 1987 [JP] Japan .................. 62-150106

[51] Int. Cl.$^4$ .......................... H03D 1/02; H03K 9/02
[52] U.S. Cl. ................................ 329/104; 329/145; 375/41; 375/94
[58] Field of Search ................ 329/104, 109, 145; 455/201–204, 337; 375/41, 43, 77, 94

[56] References Cited

U.S. PATENT DOCUMENTS 3,792,364  2/1974  Ananias ........................ 329/145 X
4,731,796  3/1988  Masterton et al. ............... 375/43 X Primary Examiner—Siegfried H. Grimm
Attorney, Agent, or Firm—Gerald J. Ferguson, Jr.

[57] ABSTRACT

An AM demodulator of a digital signal processing type wherein an analog AM signal is converted to a digital AM signal, the digital AM signal is squared and a one sample-delayed version of the digital AM signal is squared, these squared signals are added, and the square root of the resulting sum of the squared signals is extracted as an AM demodulated signal. The demodulator comprises a detector for detecting the level of a sum signal representing the sum of the squared signals, an upward bit shifter for bit shifting upwardly the sum signal on the basis of the detection output from the level detector, a polynomial calculator for approximately extracting the square root of the sum signal, and a downward bit shifter for bit shifting downwardly the output signal from the polynomial calculator.

5 Claims, 1 Drawing Sheet

AM DIGITAL DEMODULATOR

FIELD OF THE INVENTION AND RELATED ART STATEMENT

The present invention relates to an AM demodulator of a digital signal processing type.

Conventionally, in order to demodulate an analog AM signal, many detectors including a rectification-detector, an envelope detector and a square detector have been proposed and put to practical use. However, in the case of analog signal processing, an error due to the aging and ambient conditions of the circuit elements is large and the circuit operation is unstable. Therefore, an additional circuit such as a temperature stabilized circuit is provided which, however, increases the cost.

Recent developments in digital signal processing techniques have been accompanied by the proposal of AM demodulators of a digital signal processing type. The demodulator converts an input analog signal to a digital signal using an A/D converter and demodulates the digital signal using digital processing devices such as an adder, a multiplier and/or a memory. Therefore, it has many advantages. For example, it eliminates the need for adjustment of the circuit elements, and highly stabilizes and miniaturizes the circuit elements.

FIG. 1 is block diagram of one of some proposed digital AM demodulators excellent in distortion characteristic. The digital AM demodulator of FIG. 1 extracts the square root of the sum of squared signals to provide an output proportional to the envelope of the carrier.

Input to an input terminal 1 is a digital AM signal which is obtained by sampling an analog AM signal and converting the resulting signal to a binary digital signal. The digital AM signal is squared by a multiplier 3 and also delayed simultaneously by one sample by a register 2 including a delay element D. The delayed signal is squared by a multiplier 4 and added by an adder 5 to the squared signal output from the multiplier 3. The resulting signal is the sum of the two squared signals and is subjected to a square root extraction by a square root function unit 6.

The resulting signal from the root function unit 6 is fed to a digital high pass filter 7 so that direct current (DC) components are filtered off from the signal. Thus an AM demodulated signal proportional to the envelope of the carrier is provided to an output terminal 8.

The use of digital AM demodulators constituting an AM demodulator using digital signal processing techniques is expected to increasingly spread and develop together with the development of IC techniques.

The above conventional digital AM modulator is sufficiently effective in principle, but it does not necessarily operate satisfactorily from a practical standpoint.

It uses a ROM (Read Only Memory) table or a special purpose digital square root extractor as the square root function unit 6, but the ROM table has the drawback that its capacity becomes very large in order to increase the accuracy with which the square root is extracted. If a special purpose digital square root extractor is used, it takes much time for the extraction of the square root to fall within a predetermined accuracy.

As just described above, the prior art demodulator has the drawbacks that its cost increases due to the use of a memory having a very large capacity, that it takes much time for the prior art demodulator to perform an arithmetic operation and hence that the modulator is not suitable for practical purposes.

OBJECT AND SUMMARY OF THE INVENTION

The present invention derives from contemplation of the prior art problems. The object of the present invention is to provide a digital AM demodulator which is capable of performing accurate digital operation using a relatively simple circuit structure and providing a digital AM demodulated signal having an excellent distortion factor characteristic.

The present invention provides a digital AM demodulator comprising means for squaring an input binary digital AM signal obtained by sampling and quantizing an analog AM signal, a register and a multiplier for delaying the output signal from the squaring means by one sample and squaring the delayed signal, an adder for adding the respective squared signals, a function unit for extracting the square root of the sum of the squared signals output by the adder, and a digital high pass filter for filtering out possible direct current components contained in the output signal from the function unit, characterized in that the function unit includes level detecting means for detecting the level of the sum of the squared signals, an upward bit shifter for bit shifting upwardly a sum signal representing the sum of the squared signals to correct the level of the sum signal, means for extracting the square root of the corrected sum signal and a downward bit shifter for bit shifting downwardly the output signal from the extracting means to correct the level of the signal output from the extracting means.

According to the present invention, a digital AM signal is squared in one route while it is also delayed by one sample and then squared in a different route. These two squared signals are added. The level of a sum signal representing the sum of the squared signals is detected using a digit "1" or "0" of set binary data. In accordance with the detected level, the sum signal is bit shifted upwardly to correct the level of the sum signal so as to satisfy the approximate polynomial conditions for square root extraction by the polynomial calculator to ensure the accuracy of the resulting approximate value. A square root extraction is then performed. After this operation, the resulting signal is bit shifted downwardly to a level corresponding to the level of the signal before the upward level shifting. Lastly, unwanted (direct current) components of the AM demodulated signal are filtered out by the digital high pass filter. Therefore, the digital AM demodulator according to the present invention performs a high accuracy operation using a simple structure.

DETAILED DESCRIPTION OF PREFERRED EMBODIMENT

An embodiment of a digital AM demodulator according to the present invention will now be described with reference to FIGS. 2 and 3.

Figure 1:
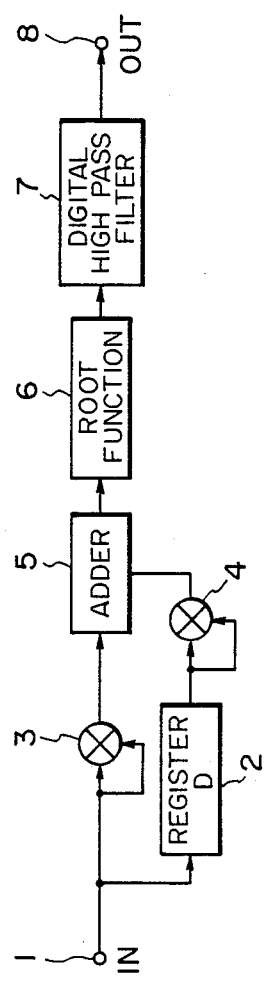
FIG. 1 is a block diagram of a conventional digital AM demodulator.
Figure 2:
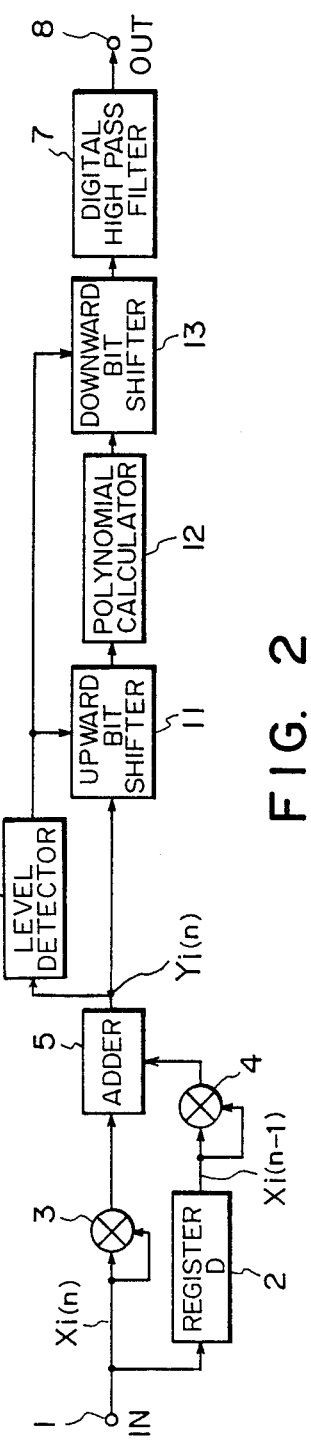
FIG. 2 is a block diagram of an embodiment of a digital AM modulator according to the present invention.
Figure 3:
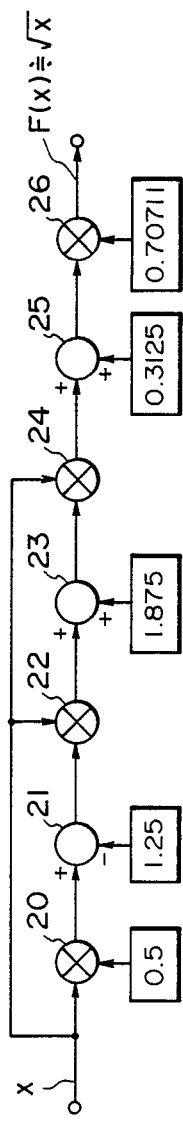
FIG. 3 is a circuit diagram of a third-degree polynomial calculator.

FIG. 2 is a block diagram of the circuit structure of the embodiment. A digital AM signal obtained by sampling an analog AM signal and converting the sampled signal to a digital binary signal is input to an input terminal 1. A register 2 including a delay element D, multipliers 3 and 4 which perform a squaring operation, and an adder 5 are the same as those of the FIG. 1 prior art.

The input signal is denoted by $X_i(n)$, and the output from the register 2 including a one sample-delayed version of the signal $X_i(n)$ is denoted by $X_i(n-1)$. Those signals each are squared by the corresponding one of the multipliers 3 and 4, and added by the adder 5 to be provided as an output signal comprising the sum of the squared signals, $Y_i(n)$. If the carrier frequency $f_c$ of the digital AM signal and sample frequency $f_s$ satisfy the following formula:

$$4 f_c = f_s (1 + 2m) \qquad (1)$$

where m is an integer, the signals $X_{in}$ and $X_{in-1}$ correspond to sample points having a carrier frequency $f_c$ and a 90° difference therebetween. Therefore, the signal $Y_{in}$ is the value of the squared carrier amplitude. The extraction of the square root of the signal $Y_{in}$ involves the extraction of the carrier amplitude, namely, the modulated signal level of the AM modulated signal, and thus the AM demodulation is performed.

The feature of the present invention lies in the extraction of the square root of the signal $Y_{in}$ using the following method.

The square root extractor which performs a square-root extraction includes a detector 10 for detecting the level of the signal $Y_{in}$, an upward bit shifter 11, a polynomial calculator 12, and a downward bit shifter 13.

The polynomial calculator 12 calculates the approximate value of the square root of a variable in a certain range. The coefficients of a polynomial are obtained by Taylor expansion of a square root function.

First, when x is in a range of from 0.25 to 1.00, the coefficient of the approximate square root polynomial F(x) is beforehand calculated in the polynominal calculator 12 so as to provide the most approximate value of the square root of x.

Next, the level of the output signal $Y_{in}$ of the adder 5 as an object of the square root calculation is detected by the level detector 10. The level of the output signal from the level detector 10 is corrected by the upward bit shifter 11. The square root extraction of the level-shifted signal is performed using the before-hand calculated approximate square root polynomial within a set range of x's. After this calculation, the level of the resulting signal is corrected by the downward bit shifter 13. In this way, all the $Y_{in}$ signals have substantially the same accuracy with which their square root extraction has been performed.

Now, as an example, a cubic approximate polynomial of a root function $\sqrt{x}$ satisfying the above conditions will be expressed as follows.

$$\sqrt{x} \approx F(x) = (x(x(0.5x - 1.25) + 1.875) + 0.3125) \times 0.70711 \qquad (2)$$

where x=0.5.

Equation (2) provides an excellent approximate value of the square root of x when x=0.25-1.

A specific circuit structure of the polynomial calculator 12 on the basis of the cubic expression (2) is shown in FIG. 2.

An input signal x is multiplied by a factor of 0.5 at the multiplier 20. A constant of 1.25 is subtracted from the output of the multiplier 20 at an adding and subtracting unit 21. The output from the unit 21 is multiplied by x at the multiplier 22, and a constant of 1.875 is added at the adder 23 to the output from the multiplier 22. The output from the adder 23 is multiplied by x at a multiplier 24. A constant of 0.3125 is added to the output signal from the multiplier 24 at an adder 25, the output of which is multiplied by 0.70711 at a multiplier 26. These calculations are performed digitally and an output signal results.

While the square root of x is expanded as mentioned above using the cubic polynomial (2), the output signal $Y_{in}$ of the adder 5 is actually not necessarily in a range of 0.25-1.00. Therefore, the level correction is required before and after the square root extraction by the polynomial calculator 12.

If, for example, the level of the signal $Y_{in}$ is given by;

$$0.25/k \leq Y_{in} \leq 1/k$$

The square-root function of the level of the signal $Y_{in}$, $\sqrt{Y_{in}}$, is given by;

$$\sqrt{Y_{in}} = \sqrt{\frac{k \cdot Y_{in}}{k}} = \frac{1}{\sqrt{k}} F(k \cdot Y_{in}) \qquad (3)$$

If $k = 4^n$ where n is a natural number, the formula (3) is given by;

$$\sqrt{Y_{in}} = \frac{1}{2^n} F(4^n \cdot Y_{in}) \qquad (4)$$

Therefore, the value of the signal $Y_{in}$ is shifted upwardly by 2n bits at the upward bit shifter 11 in accordance with the level of the signal $Y_{in}$ and the resulting output from the shifter 11 is supplied to the polynomial calculator 12.

If the approximate square root polynomial F(x) is calculated at the polynomial calculator 12 and the result is shifted by n bits downwardly at the downward bit shifter 13, the approximate values with all the values of signals $Y_{in}$ have substantially the same calculation accuracy. While the cubic expression has been described as an example, the present invention may, of course, be applicable to other higher-degree polynomials. In that case, as the degree of a polynomial increases, the calculation accuracy is improved.

The table below shows the relationship between the value of the signal $Y_{in}$ and a quantity of bit shift before and after the square root extraction by the polynomial calculator 12 wherein 8-bit data is taken as an example.

TABLE

Relationship between range of 8-bit data input levels and quantity of bit shift:

| Range | Range of input signal levels | Quantity of upward shift bits | Quantity of downward shift bits |
|---|---|---|---|
| 1 | 0.1111111–0.0100000 | 0 | 0 |
| 2 | 0.0011111–0.0001000 | 2 | 1 |
| 3 | 0.0000111–0.0000010 | 4 | 2 |
| 4 | 0.0000001–0.0000000 | 6 | 3 |

The "1" of the third, fifth and seventh bits from the most significant bit in the range of the input signal levels in the Table corresponds to the respective ranges of the input signal levels, so that the level detector 10 performs level detection by sequentially determining in this order whether the position of the third, fifth and seventh bits from the most significant bit is "1" or "0".

The level detector 10 detects the level of the input signal $Y_{in}$, and sets the range 1-4 of the Table. The upward bit shifter 11 upwardly shifts by 0-6(2n) bits the input signal $Y_i(n)$. The polynomial calculator extracts the square root of the resulting signal. Then, the downward bit shifter 13 downwardly shifts the output from the calculator 12 by 0-3(n) bits. The resulting signal is supplied to the digital high pass filter 7.

In summary, the level of the sum $Y_{in}$ of the squared signals is detected, appropriate bit shift is performed to ensure the calculation accuracy, and square root extraction is performed to provide an AM demodulation. Finally, DC components of the signal from the downward bit shifter is filtered out by the digital high pass filter 7 to thereby provide at the output terminal 8 an AM demodulated signal proportional to the envelope of the carrier.

As described above, according to the inventive digital AM demodulator, when the square root extraction is to be performed, the level of the digital AM signal is detected, the level of the digital AM signal is shifted to a preset calculator input level, the calculator input signal level is limited within a range suitable for the polynomial calculator to thereby improve the accuracy of the calculation. The demodulator according to the present invention has the advantage that its calculating scale is small and does not need a memory having a large capacity.

In addition, the processing time required for the calculation is short, and signal processing is performed on a real time basis. The circuit structure is simple and realized inexpensively.

We claim:

1. An AM demodulator of a digital signal processing type wherein an analog AM signal is converted to a digital AM signal, the digital AM signal is squared and a one sample-delayed version of the digital AM signal is squared, these squared signals are added, and the square root of the resulting sum of the squared signals is extracted as an AM demodulated signal, comprising:
   a level detector for detecting the level of a sum signal representing the sum of the squared signals;
   an upward bit shifter for bit shifting upwardly the sum signal on the basis of the output from the level detector to correct the level of the sum signal;
   a polynomial calculator for approximately extracting the square root of the level corrected sum signal; and
   a downward bit shifter for bit shifting downwardly the output signal from the polynomial calculator to correct the level of the just mentioned output signal.

2. A digital AM demodulator according to claim 1, wherein fixed constants used in the polynomial calculator are coefficients of a polynomial having a limited order obtained by Taylor expansion of a square root function.

3. A digital AM demodulator according to claim 1 or 2, wherein the polynomial calculator provides a square root output having the highest approximation for an input signal in a range of from 0.25 to 1.

4. A digital AM demodulator according to claim 1 or 2 wherein when the quantity of bit shift at the upward bit shifter is 2n bits, the quantity of bit shift at the downward bit shifter is n bits.

5. A digital AM demodulator according to claim 3, wherein when the quantity of bit shift at the upward bit shifter is 2 bits, the quantity of bit shift at the downward bit shifter is n bits.

* * * * *